United States Patent [19]

Sakuma et al.

[11] Patent Number: 5,780,869
[45] Date of Patent: Jul. 14, 1998

[54] SEMICONDUCTOR INTEGRATED CIRCUIT MEANS COMPRISING CONDUCTIVE PROTEIN ON INSULATING FILM OF CALCIUM PHOSPHATE

[75] Inventors: Shuji Sakuma; Kiminori Atsumi; Tsutomu Ishizaki, all of Tokyo, Japan

[73] Assignee: Kabushiki Kaisha Sangi, Tokyo, Japan

[21] Appl. No.: 408,257

[22] Filed: Mar. 22, 1995

[51] Int. Cl.⁶ .................. H01L 29/45; H01L 29/51
[52] U.S. Cl. .......................... 257/40; 257/410
[58] Field of Search ........................ 257/40, 410

[56] References Cited

U.S. PATENT DOCUMENTS

| | | | |
|---|---|---|---|
| 4,764,416 | 8/1988 | Ueyama | 428/212 |
| 4,783,605 | 11/1988 | Tomisawa | 257/40 |
| 4,794,171 | 12/1988 | Tagaya et al. | 530/417 |
| 5,011,786 | 4/1991 | Isoda | 428/212 |
| 5,213,983 | 5/1993 | Gustafsson | 257/40 |
| 5,252,719 | 10/1993 | Takeda | 257/40 |

FOREIGN PATENT DOCUMENTS

| | | |
|---|---|---|
| A-0 274 608 | 4/1988 | European Pat. Off. . |
| A-0 264 353 | 7/1988 | European Pat. Off. . |
| A-42 31 610 | 4/1993 | Germany . |

OTHER PUBLICATIONS

European Search Report, Application No. EP 95 30 7456, Oct. 15, 1996.

Patent Abstracts of Japan, vol. 18, No. 340 (E–1569), Jun. 27, 1994.

*Primary Examiner*—Jerome Jackson
*Attorney, Agent, or Firm*—Finnegan, Henderson, Farabow, Garrett & Dunner

[57] ABSTRACT

A semiconductor circuit means having an electrode of a conductive protein, cytochrome C and/or mitochondria, which is attached to an insulating film of phosphate, especially calcium phosphate, deposited on a substrate of a silicon monocrystal. A small and effective integrated circuit is obtained.

2 Claims, 2 Drawing Sheets

5,780,869

SEMICONDUCTOR INTEGRATED CIRCUIT MEANS COMPRISING CONDUCTIVE PROTEIN ON INSULATING FILM OF CALCIUM PHOSPHATE

BACKGROUND OF THE INVENTION

This invention relates to a semiconductor circuit means having an electrode. The electrode is an electric conductive protein and has an insulating film of phosphate deposited on a substrate of a silicon monocrystal.

In general, a conventional semiconductor circuit means comprises an n type semiconductor containing a small amount of V valency atoms such as As, P and Sb as an impurity on a substrate of a pure silicon monocrystal, a p type semiconductor containing III valency atoms such as B, Ga and In as an impurity and an electric conductive metal electrode connecting semiconductors.

An insulating film of $SiO_2$ on $TaO_2$ which is formed on the substrate of a pure silicon monocrystal and completely cleaned by the conventional method, is effective for removing an unstable electrical charactor of a silicon surface. The insulating film is also used for the separation of the elements from a metal electrode, a mask of the diffusion of impurities to a definite position and a conductor of dielectric substance, and a part of MOS field effect transistor gate.

Thermal oxidation process, CVD process, Anodic oxidation process, etc, are used for the formation of a $SiO_2$ film. The formed $SiO_2$ film is processed in a desired shape by photolithography and the n or p type area is formed by an impurity diffusion process in the area where $SiO_2$ does not exist and thereafter a conductive metal electrode such as Al or Au is deposited.

This electrode is needed to be formed in a definite position by a uniformly smooth film and to avoid the reaction of the metal film with an impurity, for example, contaminated $O_2$.

It is no doubt that the use of a silicon substrate is an important factor for a semiconductor circuit means. It is also clear that the formation of an insulating film of $SiO_2$ and the use of a metal electrode affect its property. However, sometimes, a property of a semiconductor circuit means is deteriorated by the electron transfer from an electrode to the other because of the access of the two electrodes.

Therefore, narrowness of a line width of a metal electrode and a width between the circuits will be preferred for the production of a small and effective semiconductor circuit means, however, at present, it is not possible to narrow the line width of a metal electrode and the width between the circuits.

SUMMARY OF THE INVENTION

The objective of the present invention is to provide an effective semiconductor circuit means in which the line width of a metal electrode and the width between circuits could be narrowed by the prohibition of the electron transfer from an electrode to the other as the result of keeping a definite direction of the current (electron) of the electrode.

The present invention proposes to use an insulating film of phosphate, preferably calcium phosphate and more preferably hydroxy apatite, calcium tertialy phosphate etc., in place of currently being used $SiO_2$ insulating film on a silicon substrate and an electrode consisting of a conductive protein, for example cytochrome c, mitochondria, etc. in place of a metal electrode of Al, Au, etc.

DETAILED DESCRIPTION OF THE PREFERRED EMBODIMENT

Figure 1:
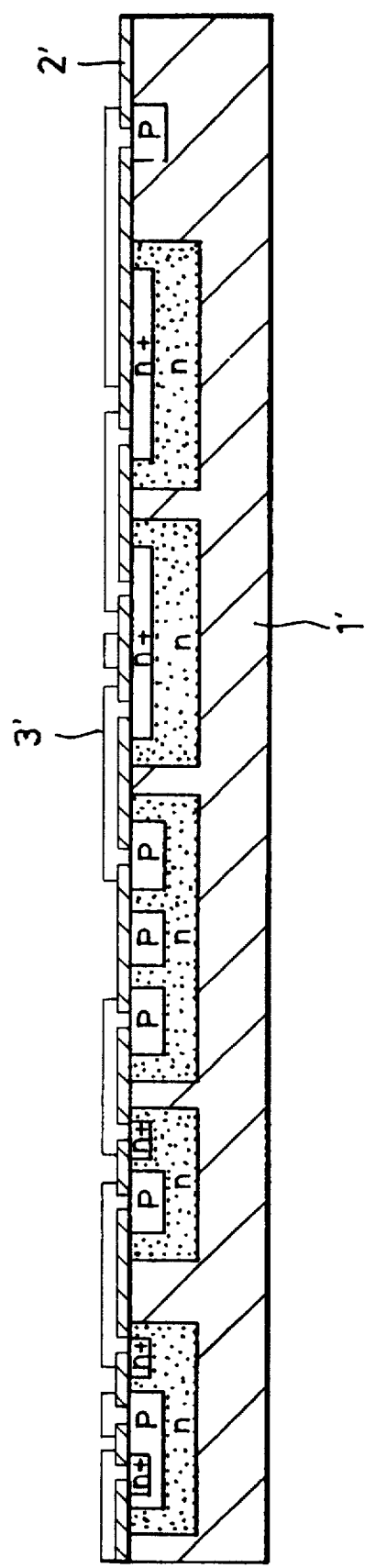
FIG. 1 is a cross section of an example of a conventional circuit element of a semiconductor IC.

An amorphous phosphate ceramics layer 2 which is an insulating film is formed on a surface of a substrate 1 by coating phosphate under a certain condition on a flat silicon substrate with a crystal surface of 100, 110, 111 and a definite direction of a crystal axis.

The direction of a formed insulating film 2 coincides with that of a crystal axis of a silicon substrate 1 in the under layer and could be coincided with the orientation of a protein molecule 3 in the direction of the electron transfer. Since a conductive protein 3 is firmly fixed by phosphate and its orientation and direction are definitive, the electron does not jump from an electrode into the adjacent electrode 3, even when the width of the circuit is narrowed. A fine and hard phosphate insulating film 2 which does not cause cracking is easily formed on the surface of a substrate 1 by the conventional processes CVD spattering, ionplating and its thickness is controlled easily. The electric conductive protein 3 is coated on the prescrived position and fixed by means of absorption, printing and baking. A circuit component of a transistor using hydroxyapatite as a insulating film 2 and cytochrome C as a conductive protein 3 and a element of which is insulated by a reversed bias pn conjugation, diode and a semiconductor IC connected with a resistance are concretely explained as below.

Figure 2:
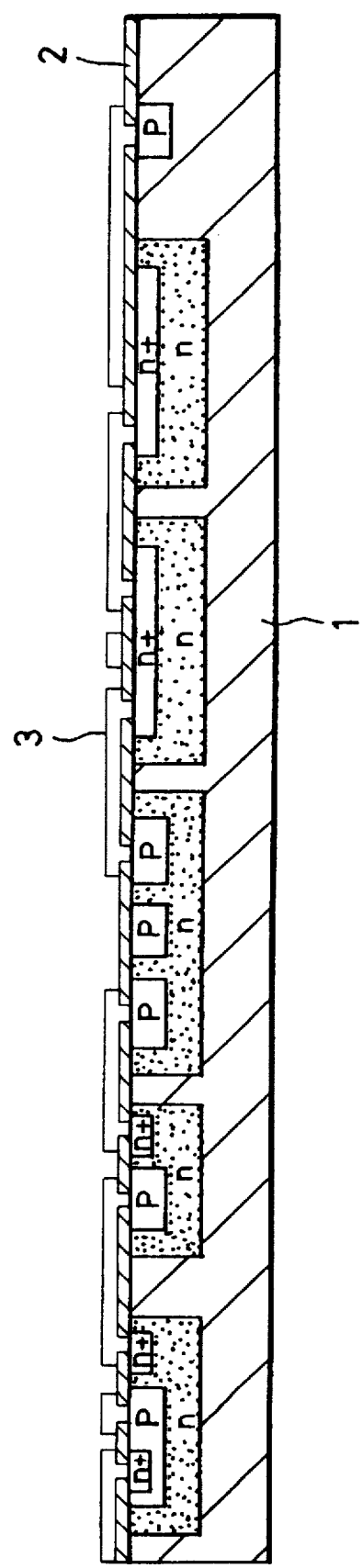
FIG. 2 is a cross section of an example of a circuit element of a semiconductor IC according to the present invention.

In FIG. 1 (a prior art) and FIG. 2, it is common that p type silicon substrate and p and n type semiconductor are used, however, it is different that in FIG. 2 hydroxyapatite film 2 is used as an insulating film 2 in place of $SiO_2$ film 2' in FIG. 1 and conductive cytochrome C 3 is used as an electrode in place of Al electrode 3' in FIG. 1. In FIG. 1, 1' denotes a silicon substrate.

As one can inter a mechanism of the semiconductor from FIG. 1 and FIG. 2, the semiconductor having the circuit element of the present invention is easily produced by a conventional method, which uses hydroxyapatite 2 in place of $SiO_2$ insulating film 2' and cytochrome C 3 in place of Al electrode 3'. Hydroxyapatite film 2 is deposited on p type silicon substrate which is completely cleaned by a conventional method by spattering. P type silicon substrate with a, film is processed by photolithography to form n and p type semiconductor.

Selected n and p type semiconductor formed on the silicon substrate 1 are connected by cytochrome C 3. Cytochrome C 3 is firmly combined with a semiconductor and a surface of a insulating film 2 of hydroxyapatite by means of absorption, printing and baking.

Since it becomes possible to give a direction for the orientation of a conductive protein using an insulating film of phosphate and keep a definite direction of the current (electron), the electron does not jump into an adjacent electrode.

It also becomes possible to increase the velocity of the electron, namely the current, compared to that of conductive metal utilizing the orientation of a conductive protein.

Furthermore, a protein could narrow the inside space of an electrode itself compared to the case of a metal and the electron transfers only to a definite direction, a small sized and effective integrated circuit is obtained as the result of a reduction of a width.

As many apparently widely different embodiments of the present invention can be made without departing from the spirit and scope thereof, it is to be understood that the invention is not limited to the specific embodiments thereof except as defined in the appended claims.

What is claimed is:

1. A semiconductor circuit means comprising an electrode of a conductive protein retained on an insulating film of calcium phosphate deposited on a smooth substrate of a silicon monocrystal, wherein said conductive protein is cytochrome C.

2. The semiconductor circuit means of claim 1, wherein said calcium phosphate is hydroxyapatite; calcium tertiary phosphate or a combination thereof.

* * * * *